US010292303B2

(12) United States Patent
Cacho Alonso et al.

(10) Patent No.: US 10,292,303 B2
(45) Date of Patent: May 14, 2019

(54) COOLING UNIT FOR COOLING THE AIR ADMITTED TO THE INTERIOR OF A SWITCHGEAR CABINET, AND A CORRESPONDING SWITCHGEAR CABINET ARRANGEMENT

(71) Applicant: RITTAL GMBH & CO. KG, Herborn (DE)

(72) Inventors: Juan Carlos Cacho Alonso, Herborn (DE); Bernd Henrichs, Herrieden (DE)

(73) Assignee: Rittal GmbH & Co. KG (DE)

( * ) Notice: Subject to any disclaimer, the term of this patent is extended or adjusted under 35 U.S.C. 154(b) by 18 days.

(21) Appl. No.: 15/565,402

(22) PCT Filed: Mar. 23, 2016

(86) PCT No.: PCT/DE2016/100143
§ 371 (c)(1),
(2) Date: Oct. 9, 2017

(87) PCT Pub. No.: WO2016/162015
PCT Pub. Date: Oct. 13, 2016

(65) Prior Publication Data
US 2018/0132379 A1 May 10, 2018

(30) Foreign Application Priority Data
Apr. 10, 2015 (DE) .................. 10 2015 105 490

(51) Int. Cl.
*F28D 15/00* (2006.01)
*H05K 7/20* (2006.01)
(52) U.S. Cl.
CPC ......... *H05K 7/20145* (2013.01); *H05K 7/206* (2013.01)

(58) Field of Classification Search
CPC ............... H05K 7/20145; H05K 7/206; H05K 7/20136; H05K 7/20009; H05K 7/20; H05K 7/20536
See application file for complete search history.

(56) References Cited

U.S. PATENT DOCUMENTS 3,571,635 A * 3/1971 Turner ..................... H02K 9/10
310/216.008
4,386,651 A * 6/1983 Reinhard ............... H05K 7/206
165/104.33
(Continued)

FOREIGN PATENT DOCUMENTS

DE 102012108110 A1 3/2014
EP 2762810 A1 8/2014
GB 2312499 A 10/1997

OTHER PUBLICATIONS

International Search Report (in English and German) and Written Opinion (in German) of the International Searching Authority issued in PCT/DE2016/100143, dated Jul. 4, 2016, ISA/EP.
(Continued)

*Primary Examiner* — Claire Rojohn, III
(74) *Attorney, Agent, or Firm* — Harness, Dickey & Pierce, PLC

(57) ABSTRACT

A cooling unit for cooling the air admitted to the interior of a switchgear cabinet (100), which cooling unit has an inner circuit, through which the air to be cooled is routed from a switchgear cabinet interior, and an outer circuit (3) which is fluidically partitioned from the inner circuit and through which the surrounding air is routed, wherein the inner circuit contains a first heat exchanger and the outer circuit contains a second heat exchanger, between which a coolant is circulating, wherein the heat exchangers have an air flow direction along which the heat exchangers allow air to pass between an air inlet side and an air outlet side, characterized (Continued)

in that at least one of the heat exchangers has a first air guide upstream on the air inlet side, which extends at an angle with $5<\beta<45°$ relative to the air inlet side and forms an air duct between itself and the air inlet side, which tapers along a dimension of the air inlet side.

7 Claims, 2 Drawing Sheets

(56) References Cited

U.S. PATENT DOCUMENTS

| | | | | |
|---|---|---|---|---|
| 5,806,583 | A * | 9/1998 | Suzuki | F28D 15/0233 |
| | | | | 165/104.14 |
| 5,823,248 | A * | 10/1998 | Kadota | F25B 23/006 |
| | | | | 165/104.33 |
| 5,844,333 | A * | 12/1998 | Sheerin | F28D 1/03 |
| | | | | 310/52 |
| 6,024,165 | A * | 2/2000 | Melane | F28D 15/0275 |
| | | | | 165/104.33 |
| 6,026,891 | A * | 2/2000 | Fujiyoshi | F28D 15/0233 |
| | | | | 165/104.33 |
| 6,119,767 | A * | 9/2000 | Kadota | F28D 15/0233 |
| | | | | 165/104.33 |
| 6,131,647 | A * | 10/2000 | Suzuki | F28D 15/0266 |
| | | | | 165/104.14 |
| 6,382,308 | B2 * | 5/2002 | Okamoto | F25B 23/006 |
| | | | | 165/104.21 |
| 6,499,532 | B1 * | 12/2002 | Williams | F28D 15/0266 |
| | | | | 165/104.14 |
| 6,742,583 | B2 * | 6/2004 | Tikka | H05K 7/206 |
| | | | | 165/261 |
| 6,761,212 | B2 * | 7/2004 | DiPaolo | F28D 1/0477 |
| | | | | 165/104.21 |
| 6,997,006 | B2 | 2/2006 | Kameyama et al. | |
| 7,878,236 | B1 * | 2/2011 | Breen | F24F 11/008 |
| | | | | 165/288 |
| 8,503,178 | B2 * | 8/2013 | Chen | F28D 1/024 |
| | | | | 361/679.48 |
| 8,991,476 | B2 * | 3/2015 | Tsubone | F28D 20/0039 |
| | | | | 165/10 |
| 9,113,579 | B2 * | 8/2015 | Cottet | H05K 7/20672 |
| 9,154,018 | B2 * | 10/2015 | Agostini | H02K 9/18 |
| 2007/0102138 | A1 * | 5/2007 | Kadota | F28D 15/0233 |
| | | | | 165/47 |
| 2007/0236881 | A1 * | 10/2007 | Harder | H05K 7/202 |
| | | | | 361/695 |
| 2010/0033042 | A1 * | 2/2010 | Hassett | H02K 9/18 |
| | | | | 310/64 |
| 2011/0088867 | A1 * | 4/2011 | Steele | F24F 3/1423 |
| | | | | 165/9 |
| 2011/0277967 | A1 * | 11/2011 | Fried | F28D 15/0266 |
| | | | | 165/104.26 |
| 2011/0277970 | A1 * | 11/2011 | Tsuji | F24F 12/006 |
| | | | | 165/121 |
| 2012/0247708 | A1 * | 10/2012 | Sklenak | H05K 7/20745 |
| | | | | 165/11.1 |
| 2012/0298330 | A1 * | 11/2012 | Mysse | H05K 5/0213 |
| | | | | 165/96 |
| 2015/0296665 | A1 | 10/2015 | Cacho Alonso | |
| 2015/0342086 | A1 * | 11/2015 | Funada | H05K 7/206 |
| | | | | 165/104.34 |
| 2017/0202109 | A1 | 7/2017 | Cacho Alonso et al. | |

OTHER PUBLICATIONS

International Preliminary Report on Patentability (Chapter II) issued in PCT/DE2016/100143 (in German) with six page annex; completed Jul. 4, 2017; IPEA/EP.

* cited by examiner

COOLING UNIT FOR COOLING THE AIR ADMITTED TO THE INTERIOR OF A SWITCHGEAR CABINET, AND A CORRESPONDING SWITCHGEAR CABINET ARRANGEMENT

CROSS-REFERENCE TO RELATED APPLICATIONS

This application is a 371 U.S. National Stage of International Application No. PCT/DE2016/100143, filed on Mar. 23, 2016, which claims priority to German Application 10 2015 105 490.6, filed on Apr. 10, 2015. The entire disclosures of the above applications are incorporated herein by reference.

FIELD

The invention starts from a cooling unit for cooling the air admitted to the interior of a switchgear cabinet, which cooling unit has an inner circuit, through which the air to be cooled is routed from a switchgear cabinet interior, and an outer circuit which is fluidically partitioned from the inner circuit and through which the surrounding air is routed. The inner circuit contains a first heat exchanger and the outer circuit contains a second heat exchanger, between which a coolant is circulating. The first and second heat exchangers may be part of a coolant circuit which is a component of a refrigerator, for example. The circulation of the coolant may occur with the aid of a compressor or a pump. The first and the second heat exchanger may also be part of a passive coolant circuit, such as a heatpipe arrangement. The heat exchangers have an air flow direction along which the heat exchangers allow air to pass between an air inlet side and an air outlet side.

BACKGROUND

This section provides background information related to the present disclosure, which is not necessarily prior art.

Such a cooling unit is known, for example, from DE 10 2012 108 110 A1. The cooling unit may be designed as a wall-mounted or roof-mounted unit. Through an air inlet opening, air is routed from the interior of the switchgear cabinet to the inner circuit. The heated air from the interior of the switchgear cabinet passes through the heat exchanger designed as an air/coolant circuit in the inner circuit and is returned as cooled air via an air outlet opening to the interior of the switchgear cabinet. The outer circuit has another air inlet opening and another air outlet opening, by which surrounding air of the switchgear cabinet arrangement is routed into the outer circuit, through the air/coolant heat exchanger arranged in the outer circuit, and back to the surroundings via the air outlet opening.

For an effective heat exchange, it is necessary for the heat exchangers to be bathed as optimally as possible by the respective air. In turn, it is necessary for this that the respective air, before impinging on the respective heat exchanger, be deflected precisely in the respective air flow direction of the particular heat exchanger. Typical heat exchangers are often designed as sheetlike components, being dimensioned substantially flatter in the air flow direction than in the two spatial directions perpendicular to this. In cooling units designed as wall-mounted units, the heat exchanger is therefore often oriented, for space considerations, so that its air flow direction extends in the depth direction of the cooling unit, in order to limit the dimension of the cooling unit in the depth direction. But since the air inlet opening and the air outlet opening by which the inner circuit communicates with the interior of the switchgear cabinet and the outer circuit with the surroundings are arranged with a vertical offset relative to the particular heat exchanger, this orientation of the heat exchanger in relation to the air inlet and air outlet openings requires that the air admitted into the inner circuit and the outer circuit is routed effectively upstream from the air inlet side of the heat exchanger so that it can flow optimally through the heat exchanger.

Thus far, this has only been inadequately solved with the cooling units known in the prior art. Often the heat exchangers are placed at a slant in order to optimize the oncoming flow, although they are always still bathed in a flow at the side, which results in a strong gradient of air velocity across the air inlet side of the heat exchanger. Thus, local air velocity peaks are med, while other regions of the heat exchanger have little or no air flow passing through them. In the regions where air passes through the heat exchanger with especially high velocity gradient, this may result, for example, in condensate formed in the heat exchanger, for example on its fins, becoming detached and hurled into the interior of the switchgear cabinet, which is undesirable.

In order to prevent this transfer of water of condensation into the interior of the switchgear cabinet, it is provided for example in DE 10 2012 108 110 A1 to arrange the heat exchanger located in the inner circuit above the air outlet opening of the inner circuit, so that the detaching condensate can be taken away to a condensate collecting tray in the lower region of the inner circuit. But this, in turn, requires increased space to accommodate all the components of the unit.

SUMMARY

This section provides a general summary of the disclosure, and is not a comprehensive disclosure of its full scope or all of its features.

Therefore, the problem which the invention proposes to solve is to further develop a cooling unit of the known kind so that it has improved efficiency, while at the same time having small structural dimensions and effective protection against unwanted transfer of water of condensation to the interior of the switchgear cabinet.

Accordingly, at least one of the heat exchangers has a first air guide arranged upstream on the air inlet side, extending at an angle which is greater than 5° and less than 45° to the air inlet side and forms an air duct between itself and the air inlet side, which tapers along a dimension of the air inlet side, so that it decreases its duct cross section along the air inlet side. The angle is preferably between 10° and 25° and especially preferably between 15 and 20°.

It may be provided that the air inlet side is a front side and the air outlet side is a back side of the heat exchanger with the first air guide located upstream, which are spaced apart from each other by side surfaces of the heat exchanger, wherein the heat exchanger is bathed in a flow across one of the side surfaces, and wherein the air duct is open toward this side surface and tapers toward an opposite situated side surface.

The side surface bathed in the flow may have a second air guide, by which the air flowing from the side onto the heat exchanger is routed upstream from the air inlet side.

The cooling unit may have a first cooling unit wall with an air inlet and an air outlet, between which the inner circuit is formed, wherein the second air guide borders on the first cooling unit wall at a distance from the heat exchanger in the inner circuit and extends from there to the air inlet side of the heat exchanger. The cooling unit wall may be a mounting side of the cooling unit, by which the cooling unit is joined to a switchgear cabinet, so that the air inlet and the air outlet empty into the interior of the switchgear cabinet.

Furthermore, the cooling unit may have a second cooling unit wall with an air inlet and an air outlet, between which the outer circuit is formed, wherein the second air guide borders on the second cooling unit wall at a distance from the heat exchanger in the outer circuit and extends from there to the air inlet side of the heat exchanger.

In order to further impede the hurling of condensate out from the heat exchanger, it may be provided that the first air guide covers a lower region of the air inlet side, so that the heat exchanger receives little or no air flow in this region.

The heat exchanger may be in particular an air/coolant heat exchanger, preferably a fin-type heat exchanger or a microchannel heat exchanger, having a condensate separator in the lower region and/or adjacent thereto. The fins may be penetrated by a pipeline system through which the coolant is circulated between the heat exchangers.

Finally, the first air guide may be a wall section of a partition wall which fluidically separates the inner circuit from the outer circuit.

Upstream from both heat exchangers there can be arranged a first air guide each at the respective air inlet side, extending at an angle which is greater than 5° and less than 45° to the respective air inlet side and forming an air duct between itself and the air inlet side, which tapers along a dimension of the air inlet side. The two first air guides here are each a wall section of a partition wall, which fluidically separates the inner circuit from the outer circuit, while the two first air guides are formed at diametrically opposite situated ends of the partition wall. The angle is preferably between 10° and 25° and especially preferably between 15 and 20°.

The partition wall with the two air guides may be formed as a single piece, for example, a plastic or sheet metal molded part.

Furthermore, it may be provided that the cooling unit has an air outlet for blowing out air cooled by means of the heat exchanger arranged in the inner circuit, wherein the air outlet side of the heat exchanger arranged in the inner circuit overlaps with the air outlet. The cooling unit makes it possible to keep the flow velocity of the air entering the heat exchanger so low that an undesirable hurling of condensate from the heat exchanger is effectively prevented. This, in turn, makes it possible to arrange the air outlet side of the heat exchanger in the air outlet, which may emerge directly into the interior of the switchgear cabinet. The opening cross section of the air outlet may be arranged parallel with the air outlet side and extend across the entire air outlet side.

The first air guide may be formed bordering directly on the air inlet side of the heat exchanger. Thus, the first air guide, which forms the air duct between itself and the air inlet side of the heat exchanger, can be formed in an edge region bordering on the air inlet side and extend from this at an angle which is greater than 0° and less than 90°. The angle is preferably between 20° and 60° and especially preferably between 25 and 45°.

The dimension of the air inlet side along which the air duct tapers may extend perpendicular to the air flow direction of the particular heat exchanger. In a wall-mounted unit, it may extend vertically.

According to another aspect, the invention concerns a switchgear cabinet arrangement, comprising a switchgear cabinet in which components dissipating heat to the air in the interior of the switchgear cabinet are accommodated, and a cooling unit of the above described kind. The air from the interior of the switchgear cabinet is routed by a first fan through the inner circuit of the cooling unit, while surrounding air of the switchgear cabinet arrangement is routed by a second fan through the outer circuit.

Thanks to the use of an air duct of the previously described kind, the air is uniformly distributed over the air inlet side of the heat exchanger and passes through it. In this way, in turn, the heat exchanger is exposed to substantially the same air pressure over its entire air inlet side, so that consequently a substantially constant air velocity profile is formed over the entire area of the heat exchanger. Furthermore, thanks to the uniform flow of air onto the heat exchanger, the formation of flow velocity peaks and thus the hurling out of condensate is prevented. Moreover, the described air guidance makes it possible, for example in wall-mounted units, to position the heat exchanger vertically and nevertheless achieve an improved air flow through the heat exchanger. The vertical positioning of the heat exchanger further prevents the hurling out of condensate. Moreover, the vertical positioning of the heat exchanger makes it possible to reduce the structural depth of the cooling unit. Since the heat exchanger in the inner circuit can now also be arranged upstream from the air outlet of the inner circuit, there is also greater freedom in the arrangement of the other components of the cooling unit.

The described cooling unit has a greater energy efficiency than those known in the prior art. This makes it possible to use smaller heat exchanges and, in the case of a refrigerator, smaller compressors. Thanks to the reduction in device dimensions, the manufacturing costs can also be further reduced. The improved heat exchange thanks to the described air guidance makes it possible to operate a refrigerator at higher evaporation temperatures, which additionally decreases the danger of condensate formation.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Further details of the invention will be explained with the aid of the following figures. There are shown:

DETAILED DESCRIPTION

Example embodiments will now be described more fully with reference to the accompanying drawings.

Figure 1:
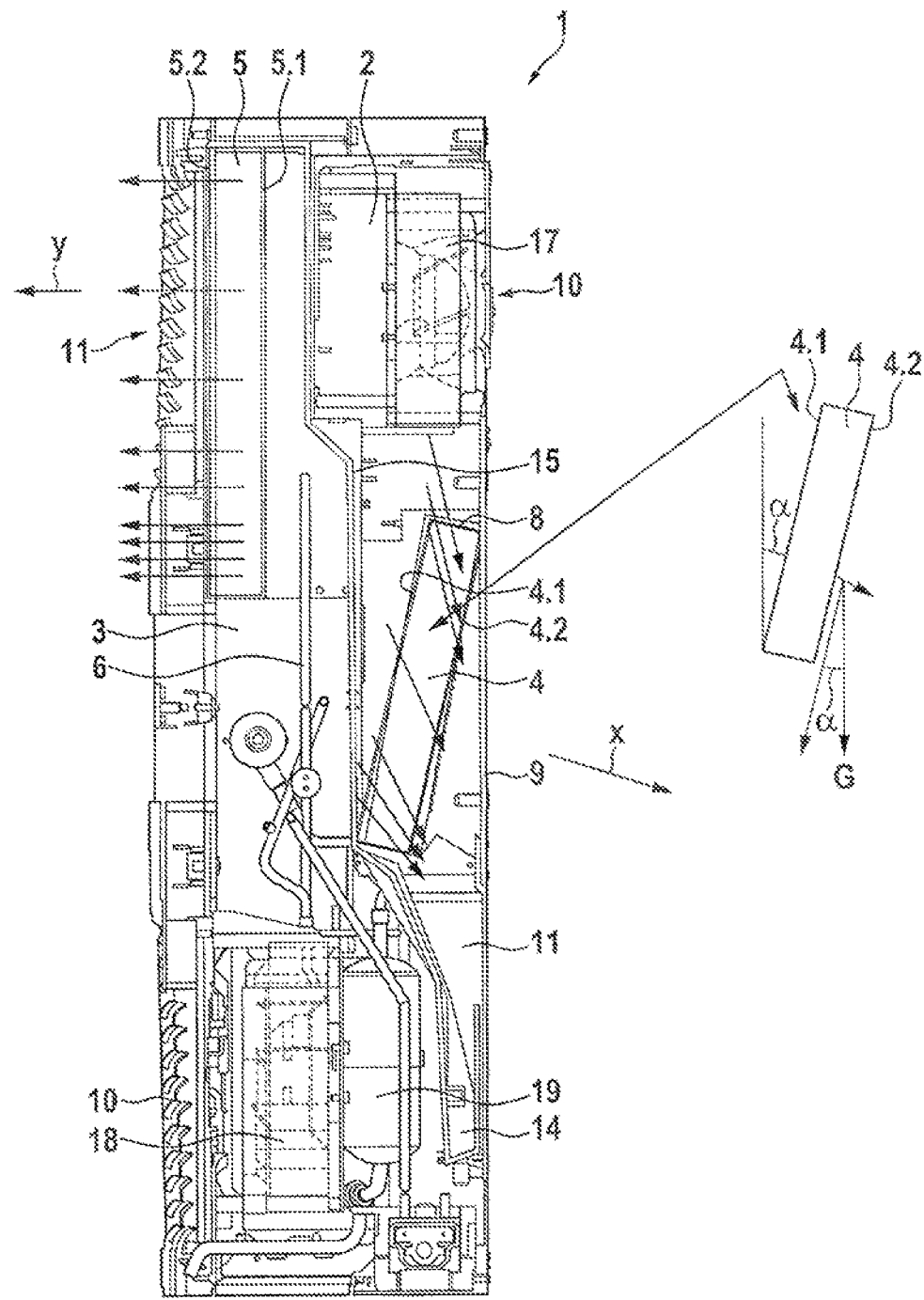
FIG. 1 shows a cooling unit in cross section according to the prior art.

FIG. 1 shows a cooling unit 1 designed as a wall-mounted unit for the air conditioning of a switchgear cabinet, such as is known in the prior art. The cooling unit 1 has an inner circuit 2 and an outer circuit 3, which are fluidically separated from each other by a partition wall 15. With the aid of a first fan 17, heated air from the interior of the switchgear cabinet 101 is drawn in through an air inlet 10, guided through the inner circuit 2 and the first heat exchanger 4 arranged therein, and routed as cooled air via the air outlet 11 back to the interior of the switchgear cabinet 101.

In order to achieve a better air flow through the first heat exchanger 4 in the inner circuit 2, this is placed at a slant. As indicated by the arrows passing through the first heat exchanger 4, however, the first heat exchanger 4 is bathed in a nonuniform flow across its air inlet side 4.1 and also in particular across its upper side surface 8. Since a heat exchanger 4 is designed for example as a fin-type heat exchanger, but has a defined air flow direction x, the described sideways flow bathing the first heat exchanger 4 entails losses. In particular, this oncoming flow against the first heat exchanger 4 means that it has a nonuniform air flow over its structural height, so that in certain regions of the heat exchanger peak air pressures and thus air velocities will result, while other regions of the heat exchanger 4 have little or no flow through them.

As can be seen from the basic diagram shown at right in FIG. 1, the slanted position of the heat exchanger 4 in combination with the resulting flow velocity peaks means that the condensate formed in the heat exchanger 4 drips out or is blown out from the heat exchanger 4. In order to prevent the condensate cast out through the air outlet 11 from getting into the interior of the switchgear cabinet 101, the first heat exchanger 4 must be arranged so that the air outlet side 4.2 is covered by the cooling unit wall 9. The condensate cast out can then be collected in a condensate separator 14 and taken away from there or evaporated in a controlled manner.

The first heat exchanger 4 is fluidically connected by a coolant circuit 6 to the second heat exchanger 5 in the outer circuit. Besides the second heat exchanger 5, the compressor 19 is also arranged in the outer circuit 3 in order to easily take away the waste heat generated by it. A further fan 18 is provided in order to draw air in through the air inlet 10 from the switchgear cabinet surroundings into the outer circuit 3, move it through the second heat exchanger 5 and return it to the surroundings through the air outlet 11. The other essential components for a refrigerator, such as an expansion means and a regulating and control unit, are not shown for a simple representation.

The first and the second heat exchanger 4, 5 are formed with large air inlet sides 4.1, 5.1 and air outlet sides 4.2, 5.2 as compared to the structural depth, for an optimal heat exchange. Compared to this, the structural depth of the heat exchangers 4, 5 in the air flow direction x, y is much smaller than the dimensions of the air inlet sides 4.1, 5.1 and the air outlet sides 4.2, 5.2. This means that the heat exchangers 4,5 in a wall-mounted unit, such as is shown in FIG. 1, must be installed substantially vertical or, for better oncoming flow, slightly slanted, so that the previously described problems with the air guidance occur. The more the heat exchanger 4 is tilted to optimize the air flow through it, the more the structural depth of the cooling unit 1 must be increased accordingly.

Figure 2:
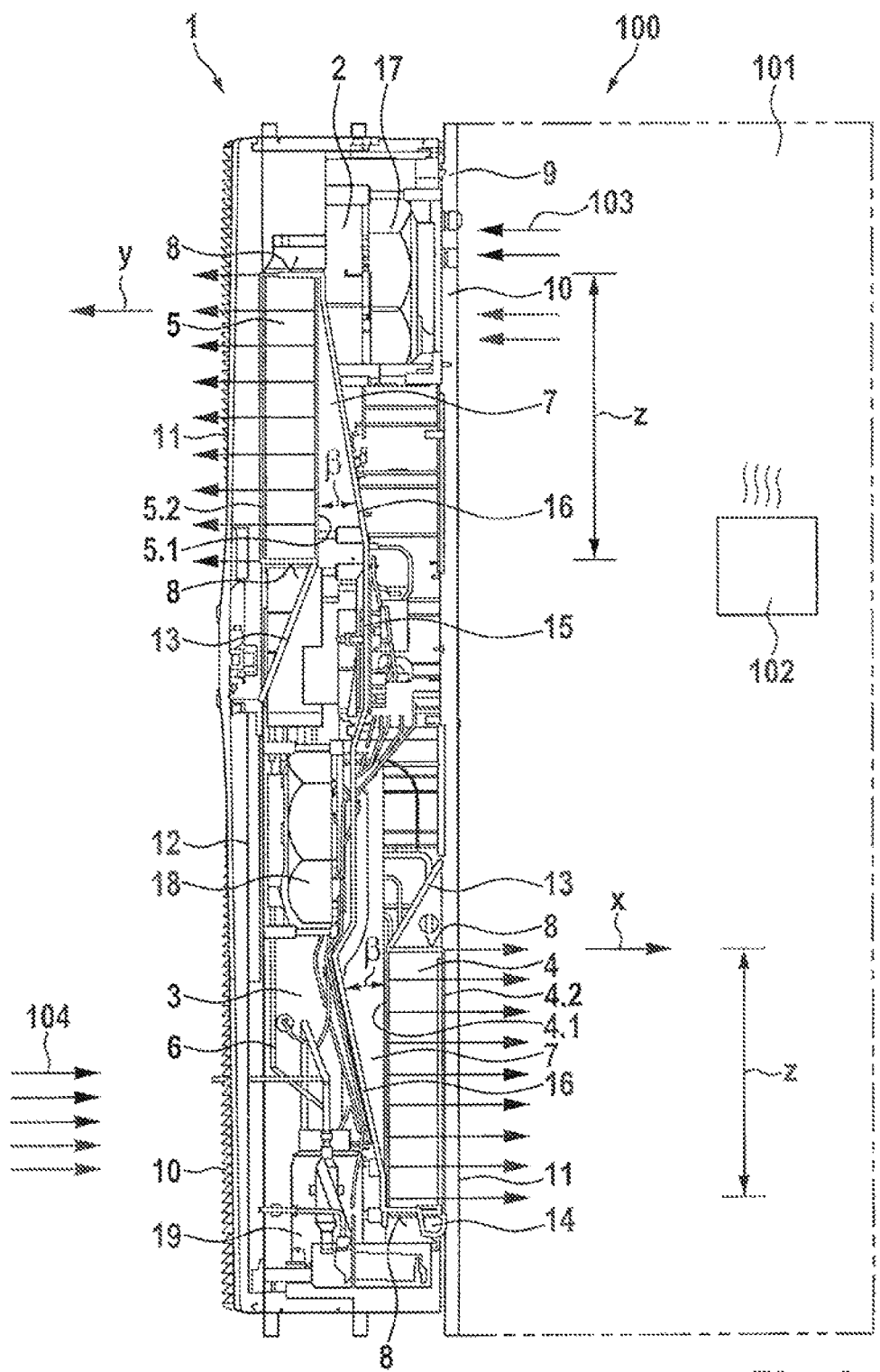
FIG. 2 shows a switchgear cabinet arrangement with a cooling unit in cross section according to one embodiment of the invention.

The switchgear cabinet arrangement according to one embodiment of the invention as shown in FIG. 2 comprises, besides a cooling unit 1, a switchgear cabinet 100 with an interior of the switchgear cabinet 101, in which heat-dissipating components 102 are arranged. The cooling unit 1 is designed to maintain the temperature of the interior of the switchgear cabinet at a nominal value, which depends for example on the optimal operating conditions for the switchgear cabinet components 102.

The cooling unit 1, in turn, has an inner circuit 2 and an outer circuit 3, while warm air 103 from the interior of the switchgear cabinet 101 is drawn into the inner circuit 2 by a first fan 17 and an air inlet 10. The air drawn in is taken through the inner circuit 2 and especially through the first heat exchanger 4 arranged therein and returned as cooled air in a lower region of the switchgear cabinet 100 into the interior of the switchgear cabinet 101 by an air outlet 11. The air inlet side 4.1 of the heat exchanger 4 in the inner circuit 2 has a first air guide 16 placed upstream from it, extending at an angle β to the air inlet side 4.1. The first air guide 16 in a lower region of the heat exchanger 4 borders on the air inlet side 4.1 of the heat exchanger 4. In the cross sectional view shown, the air duct 7 formed between the air inlet side 4.1 and the first air guide 16 has a tapering shape, roughly a wedge shape.

The wedge shape has the technical function of providing substantially the same air backpressure over the entire vertical dimension z of the air inlet side 4.1 at the air inlet side 4.1, so that the heat exchanger 4 receives an air flow of the same velocity over its entire dimension z a the formation of velocity peaks is avoided.

Furthermore, a second air guide 13 is provided, which avoids a flow against the side surface 8 of the heat exchanger 4 and instead diverts the air flow against the side surface 8 to the air inlet side 4.1. The first air guide 16 covers a lower region of the first heat exchanger 4, in which condensate normally collects. Thus, the first air guide 16 also has the function of preventing air from entering the lower region of the heat exchanger 4, so that the casting out of condensate is further suppressed. This makes it possible for the first heat exchanger 4 to be arranged flush with the air outlet 11 by which the inner circuit 2 empties into the interior of the switchgear cabinet 101, without the danger of condensate being blown into the interior of the switchgear cabinet 101.

The outer circuit 3 has a similar construction. By a second fan 18, surrounding air 104 is drawn through an air inlet 10 into the outer circuit 3, moved through the outer circuit 3 and especially through the second heat exchanger 5 and returned via the air outlet 11 to the surroundings of the switchgear cabinet. The second heat exchanger 5 also has a first air guide 16 at its air inlet side 5.1, which extends at an angle β to the air inlet side 5.1. A second air guide 13 is provided to prevent a flow against the side surface 8 of the second heat exchanger 5 and instead to guide the air flowing against the second heat exchanger 5 to the air inlet side 5.1 of the second heat exchanger 5. In the outer circuit, moreover, there is arranged a compressor 19, which is fluidically connected by a conduit system in which a coolant 6 is carried to the two heat exchangers 4, 5, in order to form a coolant circuit in the manner of a refrigerator.

The features of the invention as disclosed in the foregoing specification as well as in the claims may be essential both in themselves and also in any given combination to the realization of the invention.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A switchgear cabinet arrangement, with a switchgear cabinet comprising: a cooling unit for cooling air admitted to an interior of the switchgear cabinet, having an inner circuit, through which the air to be cooled is routed from a switchgear cabinet interior, and an outer circuit which is fluidically partitioned from the inner circuit and through which surrounding air is routed, wherein the air from the switchgear cabinet interior is routed by a first fan through the inner circuit and surrounding air of the switchgear cabinet arrangement is routed by a second fan through the outer circuit, and wherein the inner circuit contains a first heat exchanger and the outer circuit contains a second heat exchanger, a coolant circulating between the first heat exchanger and the second heat exchanger, wherein the first and second heat exchangers have an air flow direction along which the first and second heat exchangers allow air to pass between an air inlet side and an air outlet side, and wherein the two heat exchangers have a first air guide upstream on the air inlet side, which extends at an angle with $5 < \beta < 45°$ relative to the air inlet side and forms an air duct between itself and the air inlet side, which tapers along a dimension of the air inlet side, wherein the first air guides are each a wall section of a partition wall which fluidically separates the inner circuit from the outer circuit, wherein the first air guides are formed at diametrically opposite ends of the partition wall, characterized in that the first air guides cover a lower region of the air inlet side so that air does not flow through the heat exchangers in this region, wherein the air inlet side is a front side and the air outlet side is a back side of the heat exchanger with the first air guide located upstream, which are spaced apart from each other by side surfaces of the heat exchanger, wherein the heat exchanger is bathed in a flow across one of the side surfaces, and wherein the air duct is open toward the one of the side surfaces and tapers toward an opposite situated side surface, wherein the side surface bathed in the flow has a second air guide, by which the air flowing from the side onto the heat exchanger is routed upstream from the air inlet side, wherein the cooling unit has a first cooling unit wall with an air inlet and an air outlet, between which the inner circuit is formed, wherein the second air guide borders on the first cooling unit wall at a distance from the heat exchanger in the inner circuit and extends from the wall to the air inlet side of the heat exchanger, wherein the cooling unit has a second cooling unit wall with an air inlet and an air outlet, between which the outer circuit is formed, wherein the second air guide borders on the second cooling unit wall at a distance from the heat exchanger in the outer circuit and extends from the wall to the air inlet side of the heat exchanger.

2. The switchgear cabinet arrangement as claimed in claim 1, wherein the cooling unit has a second cooling unit wall with an air inlet and an air outlet, between which the outer circuit is formed, wherein the second air guide borders on the second cooling unit wall at a distance from the heat exchanger in the outer circuit and extends from the wall to the air inlet side of the heat exchanger.

3. The switchgear cabinet arrangement as claim 1, wherein the heat exchanger is an air/coolant heat exchanger, preferably a fin-type heat exchanger or a microchannel heat exchanger, having a condensate separator in the lower region or adjacent thereto.

4. The switchgear cabinet arrangement as claimed in claim 1, wherein the cooling unit has an air outlet for blowing out air cooled by the heat exchanger arranged in the inner circuit, wherein the air outlet side of the heat exchanger arranged in the inner circuit overlaps with the air outlet.

5. The switchgear cabinet arrangement as claimed in claim 1, wherein the opening cross section of the air outlet is arranged parallel with the air outlet side and extends across an entire air outlet side.

6. The switchgear cabinet arrangement as claimed in claim 1, wherein the first air guides which form the air duct therebetween and the respective air inlet side of the respective heat exchanger border the respective air inlet side in an edge region and extend therefrom at the angle.

7. The switchgear cabinet arrangement as claimed in claim 1, wherein a dimension of the air inlet side along which the air duct tapers extends perpendicular to the air flow direction of the heat exchanger.

* * * * *